(12) United States Patent
Hollars

(10) Patent No.: US 8,398,834 B2
(45) Date of Patent: Mar. 19, 2013

(54) TARGET UTILIZATION IMPROVEMENT FOR ROTATABLE MAGNETRONS

(75) Inventor: Dennis R. Hollars, San Jose, CA (US)

(73) Assignee: Nuvosun, Inc., Milpitas, CA (US)

( * ) Notice: Subject to any disclaimer, the term of this patent is extended or adjusted under 35 U.S.C. 154(b) by 407 days.

(21) Appl. No.: 12/753,814

(22) Filed: Apr. 2, 2010

(65) Prior Publication Data

US 2011/0240468 A1    Oct. 6, 2011

(51) Int. Cl.
*C23C 14/35* (2006.01)
(52) U.S. Cl. ........... 204/298.22; 204/298.21; 204/298.2; 204/298.19
(58) Field of Classification Search ............. 204/298.19, 204/298.2, 298.21, 298.22
See application file for complete search history.

(56) References Cited

U.S. PATENT DOCUMENTS

| 4,356,073 | A | | 10/1982 | McKelvey | |
|---|---|---|---|---|---|
| 4,407,713 | A | | 10/1983 | Zega | |
| 4,445,997 | A | | 5/1984 | Mckelvey | |
| 4,466,877 | A | | 8/1984 | McKelvey | |
| 4,597,847 | A | * | 7/1986 | Boys | 204/298.12 |
| 4,865,710 | A | * | 9/1989 | Aaron et al. | 204/298.2 |
| 4,957,605 | A | * | 9/1990 | Hurwitt et al. | 204/192.12 |
| 5,026,471 | A | * | 6/1991 | Latz et al. | 204/298.19 |
| 5,096,562 | A | | 3/1992 | Boozenny et al. | |
| 5,364,518 | A | | 11/1994 | Hartig et al. | |
| 5,415,754 | A | | 5/1995 | Manley | |
| 5,558,750 | A | * | 9/1996 | Szczyrbowski | 204/192.12 |
| 6,146,509 | A | | 11/2000 | Aragon | |
| 6,365,010 | B1 | | 4/2002 | Hollars | |
| 6,375,814 | B1 | * | 4/2002 | De Bosscher et al. | 204/298.21 |
| 2008/0083610 | A1 | | 4/2008 | Tang et al. | |

FOREIGN PATENT DOCUMENTS

JP          61-14194      *   1/1986
WO      WO 00/28104 A1       5/2000

OTHER PUBLICATIONS

International search report dated Dec. 19, 2011 for PCT/US11/030793.
International preliminary report on patentability and written opinion dated Dec. 19, 2011 for PCT/US2011/030793.

* cited by examiner

*Primary Examiner* — Rodney McDonald
(74) *Attorney, Agent, or Firm* — Wilson Sonsini Goodrich & Rosati

(57) ABSTRACT

Rotatable magnetron sputtering apparatuses are described for depositing material from a target while reducing premature burn through issues. The rotatable magnetron sputtering apparatus includes electric coils wound on pole pieces to modulate the magnetic fields at the ends of the magnetron magnetic assembly. Changing the direction of electric current moves the sputtering region alternately around its normal central position to decrease the rate of erosion depth at the ends of the target material.

26 Claims, 10 Drawing Sheets

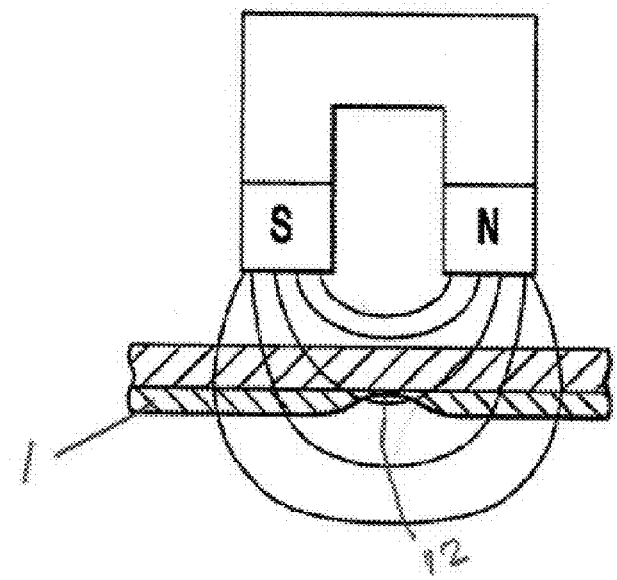
FIG. 3a.
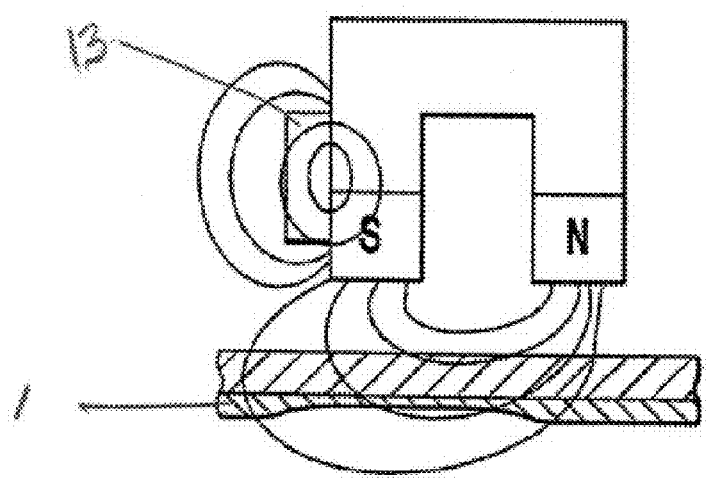
FIG. 3b
FIG. 3

TARGET UTILIZATION IMPROVEMENT FOR ROTATABLE MAGNETRONS

FIELD OF THE INVENTION

This invention relates to physical vapor deposition (PVD) devices for use in vacuum coating systems; more particularly, this invention relates to cylindrical rotatable magnetrons that are used in large area vacuum coating applications.

BACKGROUND OF THE INVENTION

Sputter deposition is a physical vapor deposition ("PVD") method for depositing thin films by sputtering, i.e., ejecting, material from a "target" (or source) onto a "substrate", such as a silicon wafer. Sputtering sources can be magnetrons that use strong electric and magnetic fields to trap electrons close to the surface of the magnetron. The electrons follow helical paths around the magnetic field lines undergoing more ionizing collisions with gaseous neutrals species near the target surface than would otherwise occur. The sputter gas is an inert, such as argon (Ar). The extra Ar ions created as a result of these collisions leads to a higher deposition rate. The plasma can be sustained at a lower pressure.

U.S. Pat. No. 4,356,073 to McKelvey ("McKelvey '073"), which is entirely incorporated herein by reference, teaches a rotatable magnetron sputtering apparatus. McKelvey '073 teaches a backing/target tube that is a straight cylinder of constant diameter. U.S. Pat. No. 4,445,997 to McKelvey ("McKelvey '997"), which is entirely incorporated herein by reference, teaches a rotatable magnetron with a non-cylindrical backing/target tube that is somewhat barrel shaped having a larger diameter over a portion of the center region. The teachings of McKelvey '997 can be applied to coating curved substrates, like the windshields of automobiles. U.S. Pat. No. 4,466,877 to McKelvey ("McKelvey '887"), which is entirely incorporated herein by reference, teaches a dual rotatable magnetron as a pair of single cylindrical magnetrons mounted in close proximity to each other, and powered simultaneously. With this arrangement two different metals (i.e., one on each magnetron) can be "co-sputtered" to form a coating on a substrate that was an alloy of the metals.

There have been improvements in the art, both in construction details and methods of incorporation in sputtering processes. For example, U.S. Pat. No. 6,365,010 to Hollars ("Hollars"), which is entirely incorporated herein by reference, teaches construction methods and process embodiments for the use of dual rotatable magnetrons for the deposition of dielectric coatings.

One issue with current single rotatable magnetrons and dual rotatable magnetrons is that the utilization of the target material is limited by excess material erosion at the ends of the target, leading to premature end of target life and inefficient utilization of the often expensive target material.

Reference will now be made to the figures, wherein like numerals refer to like parts throughout. It will be appreciated that the figures are not necessarily drawn to scale.

FIG. 1 shows a perspective cutaway view 1a illustrating the design of a typical rotatable magnetron and a top planar view 1b of the magnetic closure at each end of the device. In view 1a of FIG. 1 target material 1 is bonded to a carrier tube 2, which tube can normally be reused a number of times with the same or different target material. A pair of concentric pipes or tubes, 3a and 3b, are used to provide pressurized cooling water in and out of the magnetron as well as to support a magnetic assembly 4. In its basic form the magnetic assembly consists of a set of permanent magnets 5 arranged in straight rows with the middle row having opposite magnetic polarity to those on each side, as indicated by the north (N) and south (S) pole labels. The device can function with all of the magnets inverted with respect to the orientation in the illustration. The magnets sit on a highly permeable elongated plate or bar 6, which provides a closure path for the magnetic flux on the back side of the assembly. Mild steel and iron/nickel alloys can be used for this purpose. Mounting bar 7 supports the magnets and permeable plate and provides a means of attachment to tube 3b. A thin enclosing cover 8 protects the magnets from water damage. In operation the tubes and magnetic assembly can be held fixed while the target material and backing tube can be rotated past the magnetic assembly as indicated by the arrow. A negative direct current ("DC") voltage or an alternating voltage can be applied to the target, and the arched magnetic field (not shown) between the magnet poles provides a region of increased electron trapping which allows the device to sputter the target material at relatively low pressures compared to diode sputtering.

The magnetic assembly must terminate near each end of the target. View 1b of FIG. 1 shows a top planar view of the most common construction where the outer set of magnets are connected by a roughly circular segment of magnets 9 oriented in the same sense with the spacing 'W' between the straight segments approximately preserved around the end. View 1b also illustrates that magnetic assemblies are generally constructed using individual magnets. Often permeable continuous pole pieces are used as a cap on the individual magnets to both concentrate the magnetic flux and smooth the magnitude of the flux generated from individual magnets that usually have somewhat unequal strength. The pole pieces can be so effective in smoothing the flux that small gaps between the individual magnets can also be tolerated. This allows an additional way of adjusting magnetic field strength. These optional pole pieces have not been shown in this figure. Dashed line 10 shows the path of the central region of the arched magnetic field where sputtering of the target material proceeds at the most rapid rate. The target material erodes faster at each end because the turn-around region of the magnetic field there presents a somewhat longer sputtering path length to the direction of rotation of the target tube than do the straight sections. This effect is illustrated in FIG. 2 in views 2a and 2b. View 2a shows that target material 1 on backing tube 2 has uniform thickness before sputtering begins. View 2b shows the target at end of life after sputtering. The common problem is that the material is exhausted down to the backing tube 2 at region 11 on the ends of the target, while a significant thickness of material (about 25 to 30% in some cases) remains unused over the majority of the tube length. This premature "burn through" results in poor net utilization of target materials that are often very expensive.

An approach to resolving this problem is taught by U.S. Pat. No. 5,364,518 to Hartig et al. ("Hartig"), entitled "Magnetron Cathode for a Rotating Target". FIG. 3a and FIG. 3b illustrate certain teachings of Hartig. FIG. 3a shows the arched magnetic fields that exist between magnetic poles of opposite sense. When a voltage is applied, sputtering proceeds most rapidly at the mid point of the arched field. The shape of the sputtering groove 12 that results is approximately the inverse of the shape of the arched magnetic field as implied by FIG. 3a. More precisely sputtering proceeds most rapidly where the component of the magnetic field that is perpendicular to the local surface of target material 1 goes to zero. This is commonly referred to as the vertical component of the field. For a curved or arched magnetic field this point is also where the tangent to the magnetic field line arch is parallel to the local target material surface. FIG. 3b shows the improvement. A magnetic shunt 13 is placed across one side of the magnets. This would correspond to the outside array of magnets on the turn around indicated as 9 in FIG. 1 (view 1b). The shunt causes the arched magnetic field to become skewed as indicated. When target material 1 has full thickness, sputtering proceeds most rapidly somewhat offset towards the shunt. But as the target material gets thinner, the maximum sputtering region shifts towards the center of the magnets, thus broadening or smearing the sputtering region over a larger area. This effectively slows the erosion in the burn through region with respect to the remainder of the target. With this arrangement the length of the sputtering groove at the beginning of sputtering is somewhat longer than it is when the sputtering is finished. As a consequence, the uniformity of the deposited coating on the substrate changes slightly over the life of the target.

Other magnetic arrangements around the ends of the magnetic assembly can be used to minimize the premature burn through problem. One is to make use of magnets with variations in strength along with (usually) smaller magnets and/or highly permeable elements placed between the primary magnets to reshape the magnetic fields. Using these methods it is possible to flatten the tops of the arched fields, which also results in a broader and flatter erosion groove on the target ends. It is also possible by magnet arrangement to "split" the end groove into two grooves spaced a certain distance apart. This also helps remedy the burn through problem.

U.S. Pat. No. 6,146,509 to Aragon ("Aragon"), entitled "Inverted Field Circular Magnetron Sputtering Device", which is entirely incorporated herein by reference, teaches an inverted field circular magnetron sputtering device with no moving mechanical parts. FIG. 4 shows an isometric cutaway view of an inverted field circular planar magnetron of Aragon. The features of the magnetron of Aragon are axially symmetric, and if it were cut in half, each half would resemble an end region of a typical cylindrical rotatable magnetron as previously described. FIG. 5 illustrates the symmetric cross sectional layout of Aragon in greater detail. The primary permanent magnets at the center pole 14a and around the outer pole 14b are orientated in the same magnetic sense, as indicated by the arrows. In a "normal" magnetron the inner and outer magnets have opposite sense. The inner and outer poles of the magnetron of Aragon have the same sense, i.e., one of the poles has been inverted with respect to the "normal" sense. The magnetron of Aragon can be referred to as an "inverted field" magnetron. In addition to the permanent magnets, Aragon teaches use of a pair of independent circular coils 43 and 44 situated between the primary poles. Each coil has an associated permeable pole piece 41 and 42 respectively. The permanent magnets are capped with permeable pole pieces 16a and 16b, which cab help to concentrate the flux from the magnets as well as to smooth the flux from non-uniform magnets. This can be a common feature of most magnetrons.

By a proper selection of DC currents through the coils, magnetic poles of opposite sense to the primary poles can be created which cause the formation of two magnetic electron trapping fields 17a and 17b. Thus two concentric sputtering grooves instead of the usual single groove can be created. By varying the currents in the coils and alternately powering them, the magnetic strengths and directions of the induced magnetic poles can be changed. This will cause the sputtering grooves to move a small radial distance either in or out, improving both the target utilization and the uniformity of the deposited coating on a stationary circular substrate.

While there are approaches to resolving the burn through problem, such approaches can have their limitations. For example, magnetic arrangements for overcoming the burn through problem are rather difficult to construct correctly. Individual magnets never have exactly the same strength, so that each setup has to be individually "tweaked" into its final configuration. Also, magnets may loose magnetic strength with time, especially from over heating if the magnetron is improperly cooled, or if the cooling is interrupted during operation. If a magnetic material such as nickel is used for sputtering, the target material must be relatively thin to allow enough magnetic flux to leak through to support sputtering. In this case the shunting solution in FIG. 3b does not give ample sputtering groove movement to avert the burn through problem, and other magnetic "fixes" change with time as the target material gets thinner. A solution is to move the entire magnetic assembly in and out of the target tube by about 0.5 inches during the sputtering operation. However, this solution is impractical as it is very complicated to couple linear motion through the wall of a vacuum chamber. Most sealing arrangements can lead to leakage, and bearing surfaces have to be elongated to accept the motion. While desirable in concept, this method is difficult to accomplish in practice.

Accordingly, there is a need in the art for magnetron sputtering devices and methods that overcome the burn through problem of current sputtering devices and methods.

SUMMARY OF THE INVENTION

In one aspect of the invention, rotatable magnetron sputtering devices and methods for preventing the premature burn through of a target material are provided. In embodiments, rotatable magnetron sputtering devices that do not utilize any physically moving parts are provided.

In an aspect of the invention, a magnetic assembly for use in a cylindrical rotatable magnetron is provided. The magnetic assembly comprises a first magnet disposed toward a central portion of the magnetic assembly, the first magnet having a first magnetic orientation. The magnetic assembly further comprises a second magnet disposed toward an outer portion of the magnetic assembly, the second magnet having a second magnetic orientation that is opposite to the first magnetic orientation. The magnetic assembly further comprises one or more electromagnetic coils between the first and second magnets, the one or more electromagnetic coils wound around one or more pole pieces. The one or more electromagnetic coils are configured to provide a magnetic field having a third magnetic orientation that is parallel to one of the first and second magnetic orientations and opposite to the other of the first and second magnetic orientations.

In another aspect of the invention, a cylindrical rotatable magnetron sputtering apparatus is provided. The cylindrical rotatable magnetron sputtering apparatus comprises a magnetic assembly having one or more electromagnetic coils between a first magnet and a second magnet, the one or more electromagnetic coils configured to provide a magnetic field having a magnetic orientation that is parallel to the magnetic orientation of one of the first and second magnets and opposite the magnetic orientation of the other of the first and second magnets. The cylindrical rotatable magnetron sputtering apparatus further comprises one or more insulated wires in electric contact with the one or more electromagnetic coils, the one or more insulated wires configured to provide electric current to the one or more electromagnetic coils. The cylindrical rotatable magnetron sputtering apparatus further comprises a backing tube for housing the magnetic assembly, the backing tube configured to hold a target material. The backing tube is configured to rotate while the magnetic assembly remains stationary.

In another aspect of the invention, a cylindrical rotatable magnetron sputtering device is provided. The cylindrical rotatable magnetron sputtering device comprises a magnetic assembly having a first set of electromagnetic coils and a second set of electromagnetic coils, each of the first and second sets of electromagnetic coils disposed between a first magnet and a second magnet, each of the first and second sets of electromagnetic coils configured to provide a magnetic field having a magnetic orientation that is parallel to the magnetic orientation of one of the first and second magnets and opposite the magnetic orientation of the other of the first and second magnets. The cylindrical rotatable magnetron sputtering device further comprises one or more insulated wires in electric contact with the first and second sets of electromagnetic coils, the one or more insulated wires configured to provide electric current to each of the first and second sets of electromagnetic coils. The cylindrical rotatable magnetron sputtering device further comprises a backing tube for housing the magnetic assembly, the backing tube configured to hold a target material.

Various objects, features and advantages of the present invention will become apparent to those skilled in the art after having read the following detailed description of preferable embodiments, which are illustrated in the several figures of the drawing.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings, which are not necessarily drawn to scale, and of which:

FIG. 3a is a prior art schematic showing the sputtering erosion pattern for the typical magnetic field geometry for a cylindrical rotatable magnetron;

FIG. 3b is a prior art illustration of a magnetic shunt method of minimizing the burn through at the ends of a cylindrical rotatable magnetron;

DETAILED DESCRIPTION OF THE INVENTION

Figure 1:
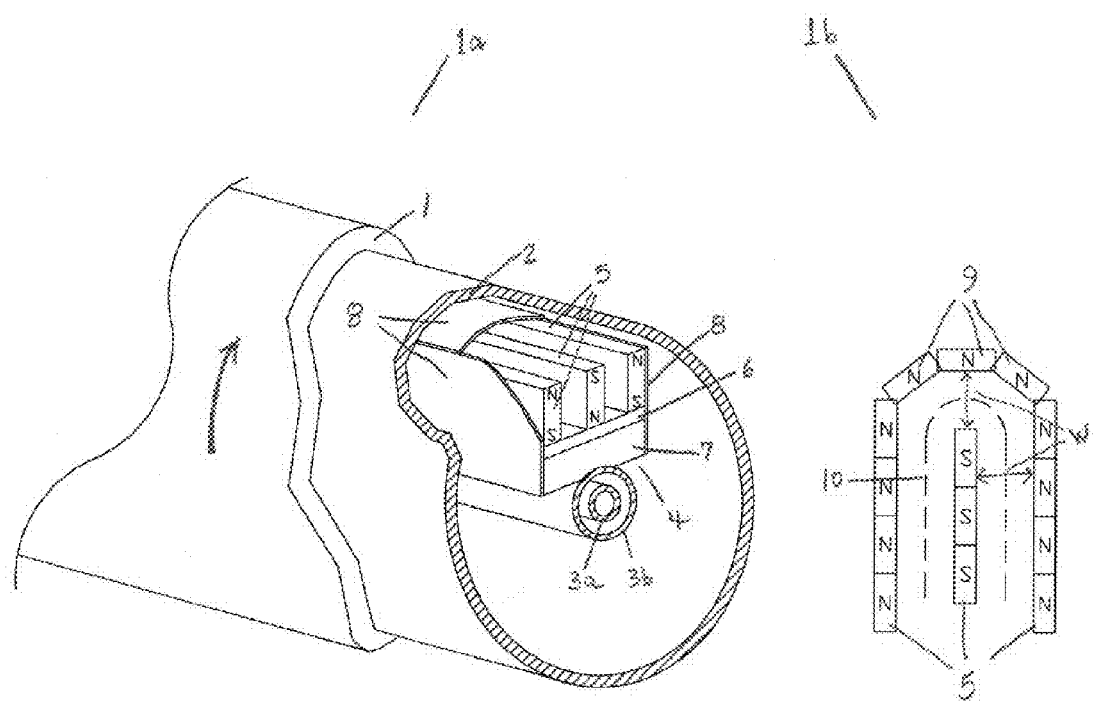
FIG. 1 is a perspective cutaway schematic view of a cylindrical rotatable magnetron, and a planar view of a typical magnetic assembly at the ends of the magnetron.

While preferable embodiments of the invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein can be employed in practicing the invention.

In aspects of the invention, magnetron sputtering devices and methods are provided. Magnetron sputtering devices of embodiments of the invention are configured to operate with physical vapor deposition ("PVD") systems, including ultra-high vacuum ("UHV") chambers having a material on which deposition of a particular target material is desired. In embodiments, cylindrical rotatable magnetrons for preventing premature burn through of a target material are provided. In various embodiments, solutions to premature burn through that do not utilize any physically moving parts are provided.

Methods and devices of embodiments of the invention reduce, if not eliminate, target burn through by providing a uniform sputtering rate across the target. In an embodiment, this is accomplished by providing a sputtering rate that is higher at certain locations than others. For example, the sputtering rate away from the ends of the target can be higher, thus providing for nearly uniform or substantially uniform sputtering across the target.

Methods and systems of embodiments of the invention are based on the realization that there are issues associated with current magnetron sputtering systems and methods. One issue with current systems and methods is that during sputtering the target depletes more quickly at certain points (e.g., the ends) than others, leading to the so-called "burn trough" problem. This can lead to high processing costs.

In embodiments, non-mechanical magnetron sputtering apparatuses and methods are provided. Apparatuses and methods of embodiments of the invention reduce, if not eliminate the burn through issues associated with current magnetron sputtering apparatuses and methods.

Magnetron Sputtering Apparatuses

In an aspect of the invention, a magnetron sputtering apparatus is provided. In embodiments, the magnetron sputtering apparatus includes a magnetic assembly. In embodiments, the magnetic assembly is configured for use in a rotatable magnetron, such as a cylindrical rotatable magnetron. In an embodiment, the magnetic assembly of the magnetron sputtering apparatus comprises a first magnet disposed toward a central portion of the magnetic assembly, the first magnet having a first magnetic orientation. The magnetic assembly further comprises a second magnet disposed toward an outer portion of the magnetic assembly, the second magnet having a second magnetic orientation that is opposite to the first magnetic orientation. The magnetic assembly further comprises one or more electromagnetic coils (also "electric coils" herein) between the first and second magnets. In embodiments, the one or more electromagnetic coils are wound around one or more pole pieces. The one or more electromagnetic coils are preferably configured to provide a magnetic field having a third magnetic orientation that is parallel to one of the first and second magnetic orientations and opposite (or anti-parallel or inverse-parallel) to the other of the first and second magnetic orientations.

In embodiments, the electromagnetic coils (also "coils" herein) can be formed of a conductor. In embodiments, the coils can be formed of one or more electrically conductive metals, such as copper (Cu). In an embodiment, the coils can be formed of insulated Cu wires. In embodiments, winding a conductive wire around a pole piece (or core) provides an inductor or electromagnet configured to produce a magnetic (or electromagnetic) field upon the flow of electric current (e.g., DC current) through the conductive wire.

In an embodiment, the magnetic assembly further comprises one or more magnetic field-shaping pole pieces disposed on top of the one or more pole pieces. The magnetic field-shaping pole pieces can be configured to produce a net magnetic field having a predetermine shape.

In an embodiment, the one or more electromagnetic coils are disposed at end portions of the magnetic assembly. In an embodiment, the one or more electromagnetic coils are arranged in an approximately or nearly curved fashion along a sputtering path at each end of the magnetic assembly. In another embodiment, the one or more electromagnetic coils are arranged in a substantially curved fashion along the sputtering path at each end of the magnetic assembly.

In an embodiment, the magnetic assembly has a length that is longer than a width of the magnetic assembly. In such a case, the magnetic assembly is cylindrical or nearly cylindrical.

In an embodiment, the first and third magnetic orientations of the magnetic assembly are parallel. In another embodiment, the second and third magnetic orientations are parallel.

In an embodiment, the first magnet of the magnetic assembly comprises a plurality of magnets. In such a case, the plurality of magnets can be arranged so as to produce a predetermined magnetic field. In another embodiment, the second magnet of the magnetic assembly comprises a plurality of magnets. In embodiments, one or more of the first and second magnets are permanent magnets.

In an embodiment, the second magnet circumscribes at least a portion of the first magnet. In a preferable embodiment, the second magnet circumscribes the entire first magnet. In an embodiment, the first magnet has a length that is larger than a width of the first magnet. In embodiments, the first and second magnets can be comprises of individual smaller magnets. In certain embodiments, individual magnets can be between about 0.5 inches and 2 inches in length, and between about 0.1 inches and 1 inch in width. In an embodiment, individual magnets can have a length of about 1 inch and a width less than about 0.5 inches.

In an embodiment, the magnetic assembly comprises, at each end, 1 or more electromagnetic coils, 2 or more electromagnetic coils, 3 or more electromagnetic coils, 4 or more electromagnetic coils, 5 or more electromagnetic coils, 6 or more electromagnetic coils, 7 or more electromagnetic coils, 8 or more electromagnetic coils, 9 or more electromagnetic coils, 10 or more electromagnetic coils, 11 or more electromagnetic coils, 12 or more electromagnetic coils, 13 or more electromagnetic coils, 14 or more electromagnetic coils, 15 or more electromagnetic coils, 16 or more electromagnetic coils, 17 or more electromagnetic coils, 18 or more electromagnetic coils, 19 or more electromagnetic coils, 20 or more electromagnetic coils, or 30 or more electromagnetic coils.

In embodiments, a rotatable magnetron sputtering apparatus (or device) is provided having a magnetic assembly comprising one or more electromagnetic coils between a first magnet and a second magnet. In an embodiment, the rotatable magnetron sputtering apparatus is cylindrical at least along one cross-section of the rotatable magnetron sputtering apparatus, in which case the rotatable magnetron sputtering apparatus be referred to as a cylindrical rotatable magnetron sputtering apparatus. In an embodiment, one or both of the first and second magnets can be permanent magnets. In embodiments, the one or more electromagnetic coils are preferably configured to provide a magnetic field having a magnetic orientation that is parallel to the magnetic orientation of one of the first and second magnets and opposite the magnetic orientation of the other of the first and second magnets. In embodiments, the magnetic assembly further comprises one or more insulated wires in electric contact (also "electrical contact" herein) with the one or more electromagnetic coils. The one or more insulated wires are configured to provide electric current to the one or more electromagnetic coils. In an embodiment, the one or more insulated wires are in electric communication with one or more power supplies, such as a direct current ("DC") power supply. In an embodiment, the magnetic assembly further comprises a backing tube for housing the magnetic assembly, the backing tube configured to hold a target material. In an embodiment, the backing tube is configured to rotate while the magnetic assembly remains stationary.

In embodiments, a cylindrical rotatable magnetron sputtering device comprises a magnetic assembly having a first set of electromagnetic coils and a second set of electromagnetic coils. Each of the first and second sets of electromagnetic coils is disposed between a first magnet and a second magnet. In an embodiment, one or both of the first and second magnets can be permanent magnets. In embodiments, each of the first and second sets of electromagnetic coils is configured to provide a magnetic field having a magnetic orientation that is parallel to the magnetic orientation of one of the first and second magnets and opposite the magnetic orientation of the other of the first and second magnets. The cylindrical rotatable magnetron sputtering device further comprises one or more insulated wires in electric contact with the first and second sets of electromagnetic coils. The one or more insulated wires are configured to provide electric current to each of the first and second sets of electromagnetic coils. In an embodiment, the cylindrical rotatable magnetron sputtering device further comprises a backing tube for housing the magnetic assembly. The backing tube is configured to hold a target material. In an embodiment, the backing tube is configured to rotate while the magnetic assembly remains stationary.

In an embodiment, the cylindrical rotatable magnetron sputtering device further comprises a plurality of insulated wires. A first subset of the plurality of insulated wires can be in electric contact with the first set of electromagnetic coils. A second subset of the plurality of insulated wires can be in electric contact with the second set of electromagnetic coils. In an embodiment, each of the first subset and the second subset of the plurality of insulated wires can be in electric contact with a separate power supply. In an alternative embodiment, the first subset and the second subset of the plurality of insulated wires can be in electric contact with the same power supply.

In an embodiment, the one or more insulated wires of the cylindrical rotatable magnetron sputtering device can include a pair of wires separately connected in parallel to the first and second sets of electromagnetic coils. In another embodiment, the one or more insulated wires can include pairs of wires, each of the pairs of wires being connected to one of the first set and the second set of electromagnetic coils. In an embodiment, each of the pairs of wires can be in electric contact with a separate power supply.

Figure 6:
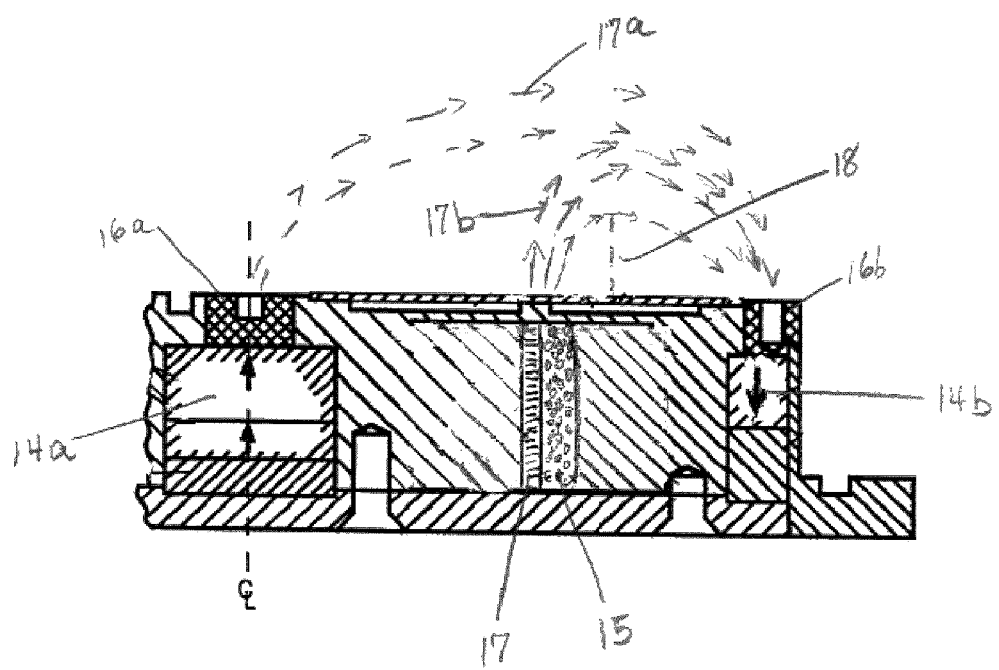
FIG. 6 is a detailed cross sectional view of a modified prior art inverted field circular planar magnetron that becomes appropriate for application to the ends of a cylindrical rotatable magnetron, in accordance with an embodiment of the invention.

With reference to FIG. 6, in an embodiment, a magnetron sputtering apparatus (or device) is shown. The magnetron sputtering apparatus includes permanent magnets 14a and 14b, or center pole and outer pole, respectively, capped with permeable pole pieces 16a and 16b. In embodiments, the sputtering apparatus includes a single electromagnetic coil (also "coil" herein) 15 wound circumferentially around a highly permeable pole piece 17. The magnetic orientation of the center pole 14a and outer pole 14b are orientated in an opposite magnetic sense, as indicated by the arrows. In the illustrated embodiment of FIG. 6, the two central coils 43 and 44 of Aragon and their associated pole pieces are replaced with the single coil 15.

With continued reference to FIG. 6, in an embodiment, the pole piece 17 helps concentrate the field produced upon the flow of current (e.g., direct current) through the single coil 15. In an embodiment, the height of the pole piece 17 can be varied to adjust the total field strength. In an embodiment, the height of the pole piece 17 can be selected so as to provide a desired (or predetermined) field strength. In an embodiment, the height can be about the same as the permanent magnets 14a and 14b and pole pieces in order to make the most efficient use of the available magnetic field strength.

With continued reference to FIG. 6, in an embodiment, orienting the permanent magnet 14b such that it has an opposite sense (or orientation) with respect to the permanent magnet 14a causes magnetic field lines 17a from permanent magnet 14a to seek a closed path through outer pole 14b. However, depending upon the direction of the DC current through coil 15, the induced direction of the combined magnetic field in pole piece 17 and the field from the coil 15 itself can be changed to match the field direction of one of pole 14a and pole 14b and opposite to the other of pole 14a and pole 14b. In the illustrated embodiment, the direction of the field in pole piece 17 matches that in center pole 14a (and opposite the field lines in outer pole 14b) so that field lines 17b (emanating from pole piece 17) also may seek closure at 14b. This causes the center of the magnetic field to be skewed away from its central position to a new position 18, where the maximum sputtering rate can occur. In an alternative embodiment (not shown), the direction of the current in coil 15 can be reversed such that the induced direction of the combined magnetic field in pole piece 17 is parallel to that of outer pole 14b and opposite to the field direction of pole 14a. In such a case, the position of maximum sputtering rate can move to the other side of pole piece 17. In embodiments, by changing the direction of current through coil 15, the position of maximum sputtering can be swept to either side of pole piece 17 and coil 15 at a rate equal to the alternating frequency of the applied DC current, which can be selected arbitrarily. In an embodiment, DC current is alternated at a frequency selected to average the deposition over the time of substrate passage through the deposition chamber. This new arrangement would also improve the target utilization of an ordinary circular planar magnetron, but the uniformity of the deposited coating on a stationary circular substrate will not be as good as for the original inverted field embodiment.

Figure 7:
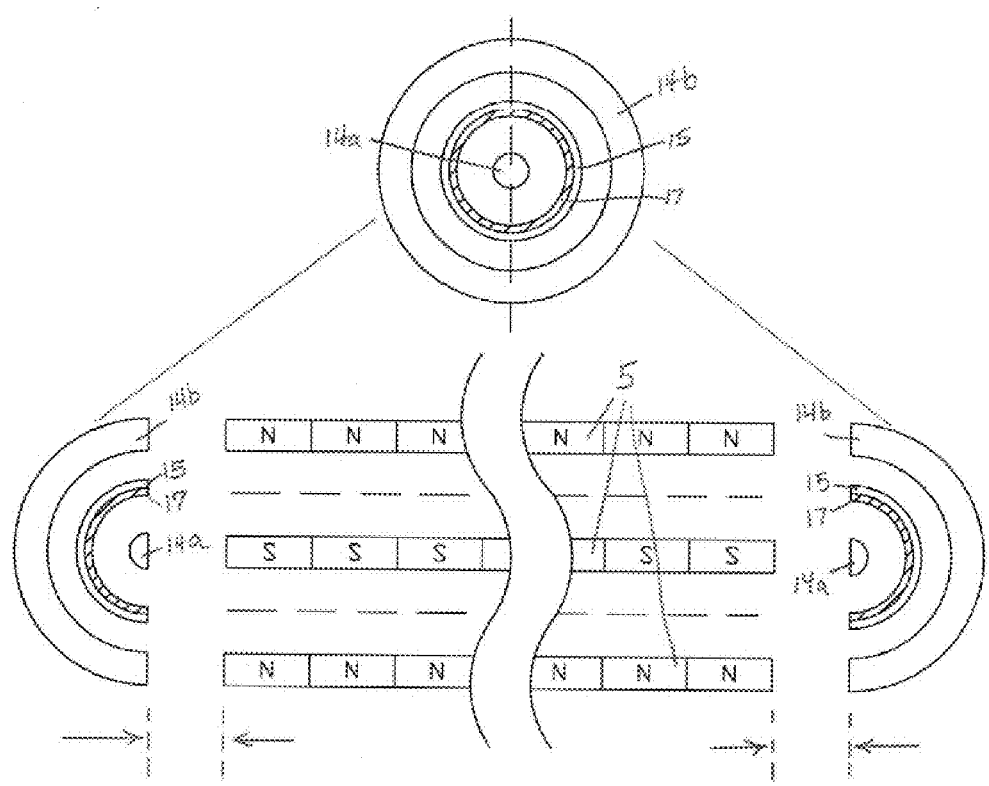
FIG. 7 is a schematic illustration showing the principle of joining the halves of a modified circular planar magnetron to the ends of an arbitrarily long straight magnetic assembly of a cylindrical rotatable magnetron, in accordance with an embodiment of the invention.

With reference to FIG. 7, a top view of a circular planar magnetron sputtering apparatus is depicted, in accordance with an embodiment of the invention. Separate half segments of circular magnetron are shown, with each half being attached to the end of an arbitrarily long straight section of the magnetic assembly of a cylindrical rotatable magnetron. FIG. 6 is a cross-sectional side view of the half segment shown at the bottom right of FIG. 7. The circular magnetron of FIG. 7 includes magnets 5. In an embodiment, the magnets 5 can be the same as those shown in views 1a and 1b of FIG. 1, and the other elements are labeled consistently with those of FIG. 6. The skilled artisan will understand that a magnetic field (and subsequent sputtering) cannot be generated if the coil 15 is cut in half, as this would prevent current flow.

Figure 8:
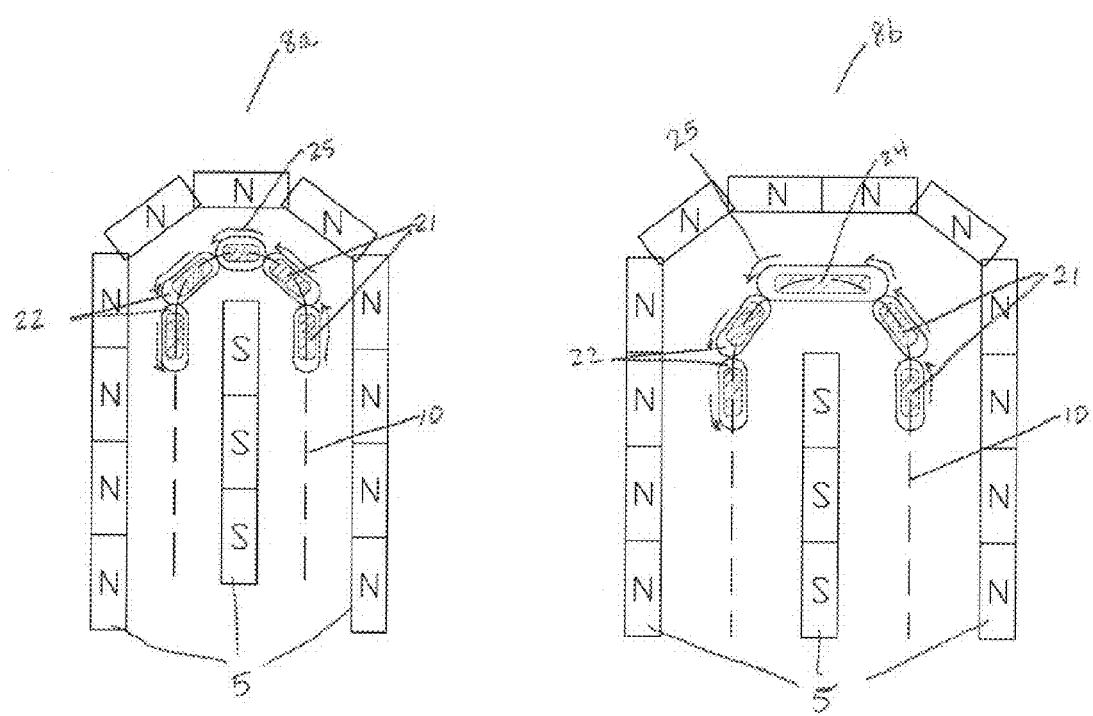
FIG. 8 shows a practical embodiment of the invention for the ends of the magnetic assemblies of cylindrical rotatable magnetrons, in accordance with an embodiment of the invention.

With reference to FIG. 8, a construction for the end of a cylindrical rotatable magnetron magnetic assembly that will accomplish the same field switching function as in the circular planar design of FIG. 6 is shown, in accordance with an embodiment of the invention. Magnetic assembly 8a can be like that described in FIG. 1 view 1b except that pole pieces 21 with coils 22 are added along sputtering path 10 in the turn around region. In an embodiment, the coils 22 are wound around the pole pieces 21. In embodiments, each of the pole pieces 21 is configured to generate a magnetic field. In an embodiment, each of the pole pieces 21 can function like the pole piece 17 of FIG. 6. The number and size of the pole pieces and coils may be adjusted to best fit the geometry of the end section of the magnetic assembly to accomplish the approximately half circular geometry derived from the circular planar case. For instance, if the assembly were wider as shown in assembly 8b, central pole piece 24 can be made longer with respect to the other pole pieces. Alternately, central pole piece 24 can be made from two shorter pole pieces. In either case, in a preferable embodiment, the coils should all be wound in the same sense as indicated by arrows 25 such that, upon the application of direct current, the resulting magnetic field vectors from pole pieces 21 are parallel to one another. In an embodiment, pole pieces 21 can be electrically connected in series to simplify the wiring to the current source. In an embodiment, a series connection can allow all five coils to be powered conveniently by a single pair of wires. If the coils are independent and powered by several sets of wires, the flow of current though all the coils can be in the same direction to produce the proper magnetic field. In an embodiment (not shown), optional continuously curved pole pieces can be added on top of the coils (top pole pieces), below the coils (bottom pole pieces), or both to smooth and shape the field further. Top and/or bottom pole pieces can provide a permanent field shape that need not exactly follow the piecewise pattern of the coils.

In embodiments, the magnetic assembly can comprise, at each end, 1 or more, or 2 or more, or 3 or more, or 4 or more, or 5 or more, or 6 or more, or 7 or more, or 8 or more, or 9 or more, or 10 or more, or 15 or more, or 20 or more pole pieces. In the illustrated embodiment of FIG. 8, the magnetic assembly comprises 5 pole pieces 21 and coils 22 at each end portion of the magnetic assembly. Magnetic assemblies (and magnetrons) of embodiments of the invention have two ends (also "end portions" herein). In an embodiment, the pole pieces 21 can be circumferentially disposed in relation to central magnet 5.

Figure 9:
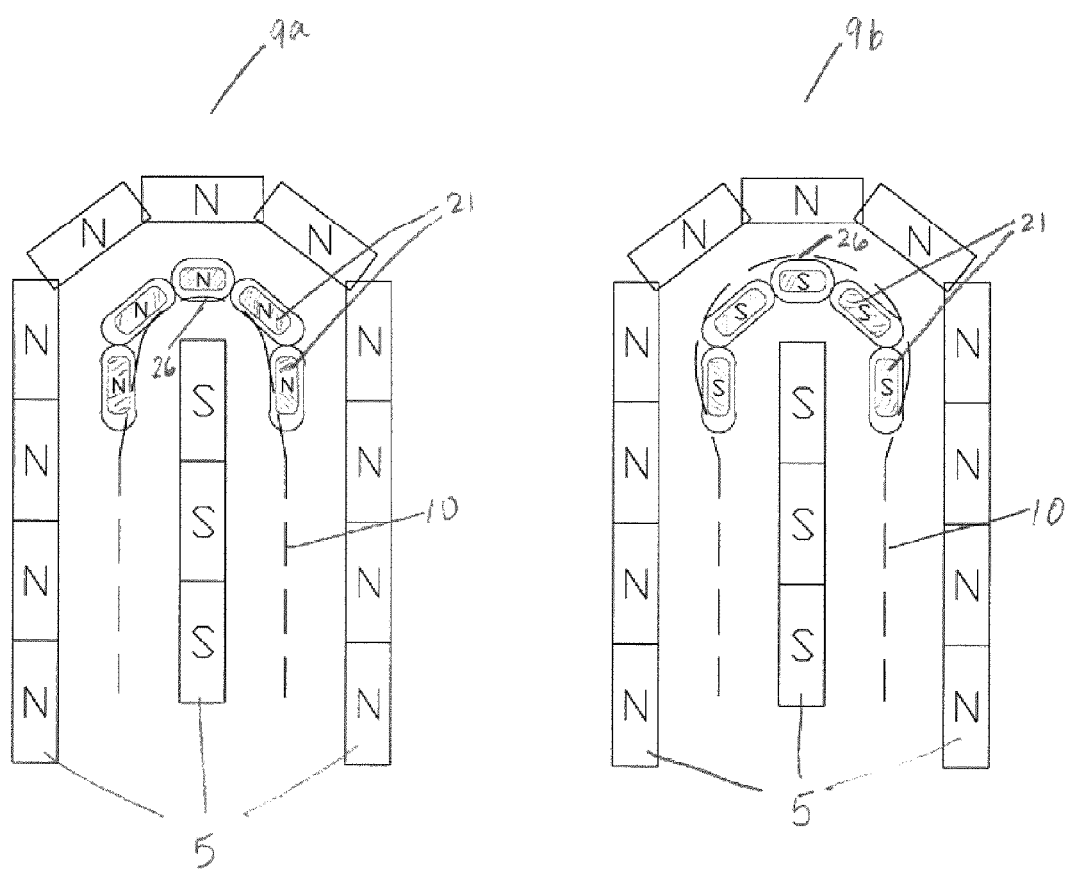
FIG. 9 illustrates the change in the position of maximum sputtering for opposite directions of the DC current through the coils of the embodiment of the invention, in accordance with an embodiment of the invention.

FIG. 9 is a planar schematic view illustrating a cylindrical rotatable magnetron magnetic assembly with DC current applied to the coils of the pole pieces 21, in accordance with an embodiment of the invention. Only one end of the magnetron is depicted since the opposite end is symmetrical in construction. In an embodiment, the direction of the DC current is changed (e.g., with the aid of a control or computer system) such that the sputtering region is moved alternately around its normal central position, thereby decreasing the rate of erosion depth at the ends of the target material. In view 9*a* the direction of the DC current is selected to produce poles that match the outer set of magnets, that is north poles in pole pieces 21. This skews the magnetic field inward toward the center south pole as indicated by sputtering path 10. When the current direction is reversed, the induced poles are inverted, becoming south poles as shown in view 9*b*. This skews the magnetic field in the opposite direction, i.e., it is forced outward toward the outer pole as indicated by new sputtering path 10. In an embodiment, the strength of the magnetic field at position 26 in both of the illustrated embodiments (9*a* and 9*b*) are approximately the same as they are without the coils in place. Thus, the sputtering rate at the ends of the cylindrical rotatable magnetron magnetic assembly does not change with position as it does in Hartig, where the field strength at the start of sputtering increasing with erosion but moves to a different position by the time the target is sputtered through.

With continued reference to FIG. 9, the orientation of the permanent magnets 5 is fixed—the inner magnet has an orientation that is inverted with respect to the orientation of the outer magnet. While the orientation of the magnets (outside inward), as illustrated, is north-north-south (view 9*a*) and north-south-south (view 9*b*), other orientations are possible. For example, the magnets can be oriented such that the polarities (outside inward) are south-south-north or south-north-north.

In an embodiment, a control system is provided for controlling the supply of power (e.g., DC power) to the electromagnetic coils of magnetic assemblies of embodiments of the invention. The control system can alternate (or modulate) the supply of DC power to one or more coils. In addition, the control system can change the direction of the DC current to the coils. The control system can further control the rate at which a target disposed on a backing tube of the rotatable magnetron rotates. In addition, the control system can control the current and/or voltage supplied to the coils. In an embodiment, the control system can control the supply of power to the coils by turning "on" and "off" one or more power supplies in electric contact with the coils.

Sputtering

In an aspect of the invention, sputtering apparatus are provided using the magnetic arrangements of embodiments of the invention.

In an embodiment, if the coils of the cylindrical rotatable magnetron magnetic assembly are wound in the same sense on each end, and if each end is powered in parallel from one pair of input wires, then for a given direction of the DC current both sputtering grooves will move either inward or outward, but together at the same time (and rate). Accordingly, the total length of the sputtering groove will get somewhat longer then shorter as the current changes direction. In another embodiment, if the coils of the cylindrical rotatable magnetron magnetic assembly are wound in an opposite sense with respect to each other and powered in the same way, then the total sputtering groove will remain constant in length but will shift back and forth along the length of the magnetron as the current direction changes. The amount of motion of the groove is dependent upon the level of the current through the coils up to the limit of the wire rating.

While certain symmetrical groove motions have been described, it will be appreciated that such symmetrical groove motions can be obtained in other ways. For example, each set of coils may be powered by separated sources that could be operated in ways to produce the two symmetrical motions. However, any number of asymmetrical motions could also be achieved, but they might not be as useful as the symmetrical ones. The frequency of change of current direction is somewhat arbitrary, but it should be selected to insure adequate averaging during the time it takes a substrate to pass through the coating area of the magnetron.

Figure 2:
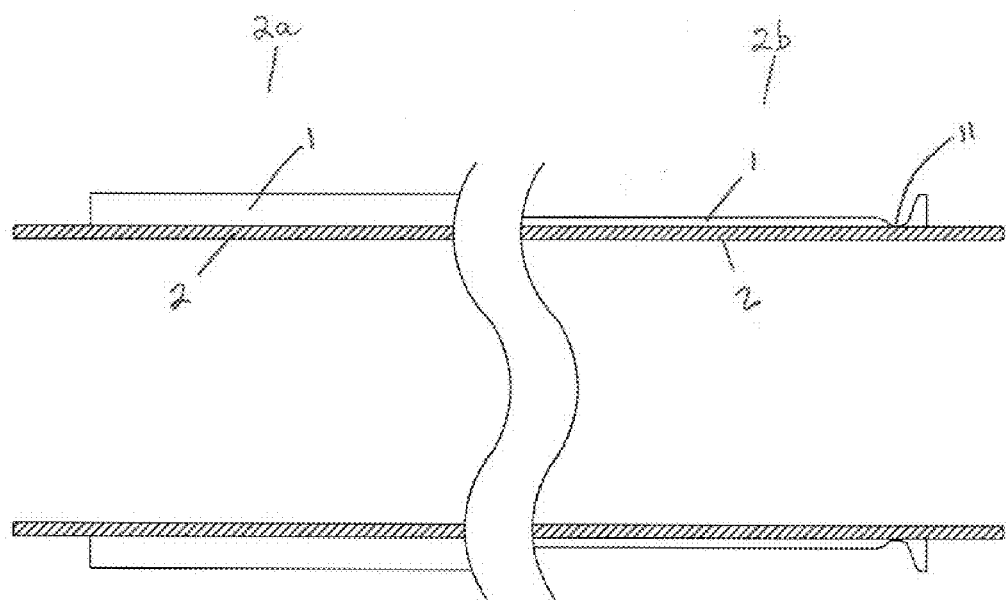
FIG. 2 is a cross sectional view of a cylindrical rotatable target on a backing tube illustrating the premature burn through at the end of the target.
Figure 4:
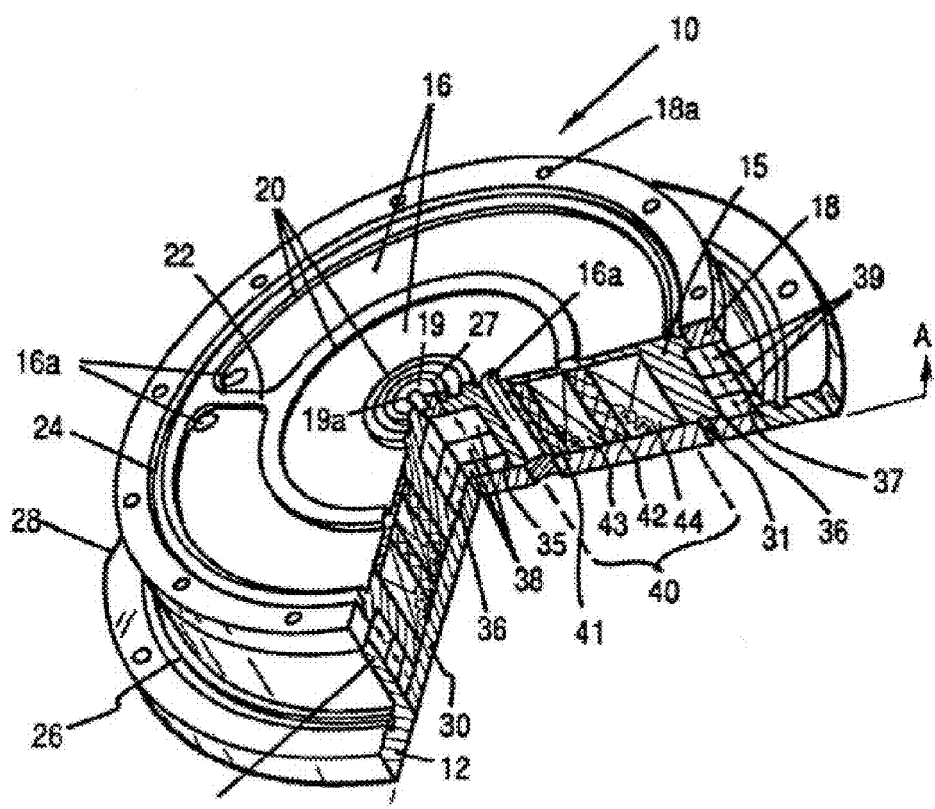
FIG. 4 is an isometric cut-away schematic diagram showing the construction and layout of a prior art inverted field circular planar magnetron.
Figure 5:
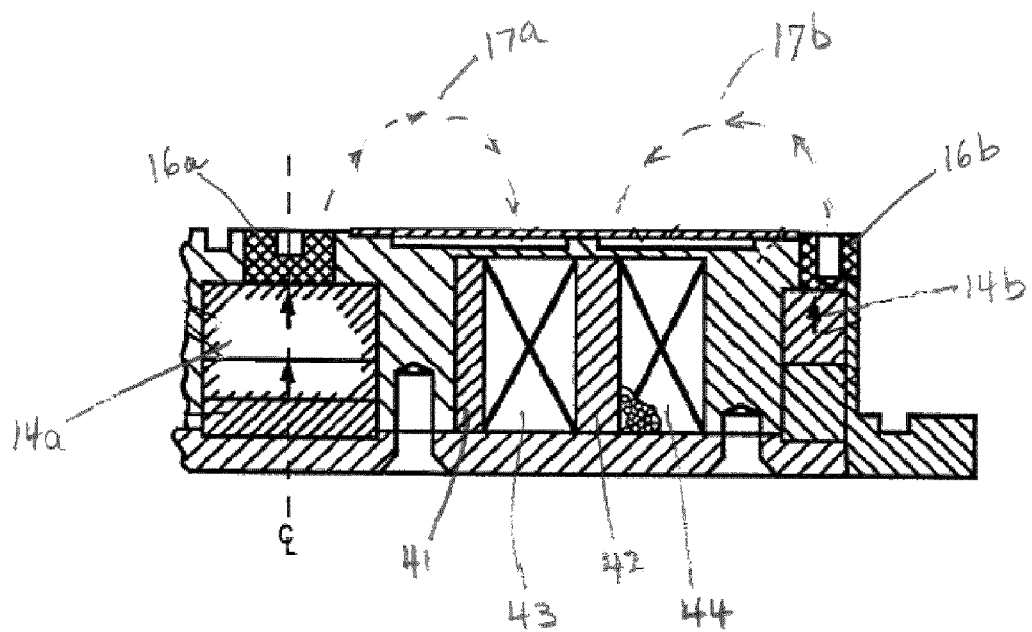
FIG. 5 is a detailed cross sectional view of a prior art inverted field circular planar magnetron that is symmetrical about the center line.
Figure 10:
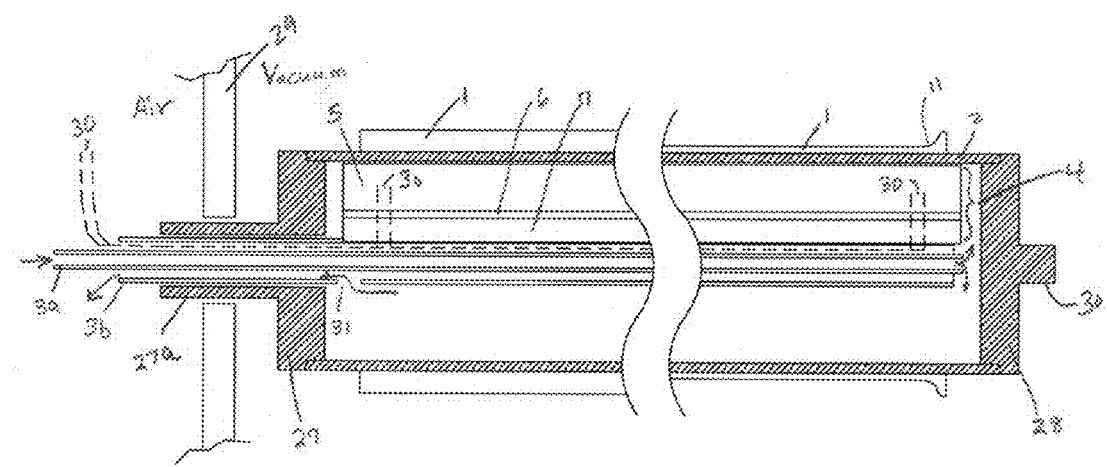
FIG. 10 depicts an embodiment where a pair of wires supplies the DC current in parallel to the coils at each of the ends of a cylindrical rotatable magnetron, in accordance with an embodiment of the invention.

FIG. 10 illustrates a cylindrical magnetron sputtering apparatus, in accordance with an embodiment of the invention. The illustrated embodiment shows one approach in bringing the DC current source to the coils of the cylindrical magnetron. Certain elements of FIG. 10 are described above in the context of FIGS. 1 and 2. End caps 27 and 28 seal the ends of backing tube 2. Cap 27 with the its extension tube 27*a* provides structural and rotational support through vacuum wall 29, while end cap 28 may be cantilevered or supported on a bearing at location 30 depending on the length and weight of the magnetron. Target material 1 along with its backing tube and end caps (hatched) rotate while tubes 3*a* and 3*b* and magnetic assembly 4 remain stationary. The split view shows the target material 1 before (left) and at a certain point after (right) the application of DC current to the coils.

With continued reference to FIG. 10, insulated wires 30 are used to carry the current to the coils. In an embodiment, two insulated wires 30 are used to carry current to the coils. In an embodiment, the wires and coils are insulated to the level of the operational voltage of the magnetron, which can be less than or equal to about 1000 volts (V). In an embodiment, the wires can fit readily into the cavity between stationary tubes 3*a* and 3*b* without any significant interference with the water flow, whose typical pattern is indicated by the arrows. Water (or any other cooling fluid) generally flows into and down inner tube 3*a* and out into backing tube 2 at the far end of the device. Tube 3*b* is sealed around the end of tube 3*a* so that water returns at the opposite end though one or several apertures 31 in outer tube 3*b*. In an embodiment, the cross sectional area of the annulus between the tubes is generally larger than the cross sectional area of tube 3*a*. In such a case, the addition of the wires in this annulus area does not limit the water flow through the device. The pair of wires 30 can have a parallel split at the first encountered set of coils. The split off pair of wires are then made to pass through small holes made in tube 3*b* and plates 6 and 7 to connect to the first set of coils. The main wires would then pass down the annulus to the end of the magnetic assembly where they are connected to the second set of coils through similar passages. Either of the symmetrical motions of the sputtering groove may be selected by the direction that wires 30 are attached to the coils, regardless of whether the coils are wound in the same or opposite sense. Clearly two individual pairs of wires could be used to power each set of coils separately, since there is ample space in the annulus between the tubes. This may be desirable in some applications if upon careful measurement of the way a particular magnetron is functioning, it becomes advantageous to have slightly different currents in each coil to make the groove motion more precisely identical on each end of the device. Since this part of the construction of the magnetron does not rotate, the wires will not be twisted during operation.

Example

Two opposite polarity rows of high energy density SmCo magnets were placed 1.5 inches apart on a mild steel backing plate. A 100-turn coil was constructed on a steel pole piece that was 2 inches long, 0.75 inches high, and 0.125 inches thick using 24 gauge copper transformer wire. The completed coil was approximately 0.25 inches thick and fit easily between the two rows of magnets. The tops of the magnets and the coil and pole piece were approximately co-planar. In a plane 0.5 inches above the plane of the tops of magnets the field strength measured about 350 gauss, well within the usual range for sputtering. A low voltage DC current of 3 amps passing through the coil was provided to move the sputtering groove 0.25 inches. Reversing the current direction moved the groove an equal amount in the opposite direction for a total movement of 0.5 inches. This much movement of the sputtering groove was enough to remove completely the premature burn through region 11 depicted in FIG. 2.

Those skilled in the art will recognize that coils made with larger gauge wire would carry higher currents and thus create larger magnetic fields. Incorporating more turns would also create higher magnetic fields for the same current. These modifications can be readily implemented if larger motion of the sputtering groove is needed or desired.

It should be understood from the foregoing that, while particular implementations have been illustrated and described, various modifications can be made thereto and are contemplated herein. It is also not intended that the invention be limited by the specific examples provided within the specification. While the invention has been described with reference to the aforementioned specification, the descriptions and illustrations of the preferable embodiments herein are not meant to be construed in a limiting sense. Furthermore, it shall be understood that all aspects of the invention are not limited to the specific depictions, configurations or relative proportions set forth herein which depend upon a variety of conditions and variables. Various modifications in form and detail of the embodiments of the invention will be apparent to a person skilled in the art. It is therefore contemplated that the invention shall also cover any such modifications, variations and equivalents.

While preferable embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein can be employed in practicing the invention. It is intended that the following claims define the scope of the invention and that methods and structures within the scope of these claims and their equivalents be covered thereby.

What is claimed is:

1. A sputtering apparatus, comprising:
    an elongated magnetic assembly, comprising:
        a first set of magnets disposed toward a central portion of the magnetic assembly, each magnet of the first set of magnets having a first magnetic orientation;
        a second set of magnets disposed toward an outer portion of the magnetic assembly, each magnet of the second set of magnets having a second magnetic orientation that is opposite to the first magnetic orientation; and
        one or more electromagnetic coils between the first and second sets of magnets, the one or more electromagnetic coils wound around one or more pole pieces, the one or more electromagnetic coils configured to provide a switchable magnetic field having a third magnetic orientation that is parallel to one of the first and second magnetic orientations and opposite to the other of the first and second magnetic orientations, wherein the one or more electromagnetic coils are disposed at end portions of the elongated magnetic assembly.

2. The sputtering apparatus of claim 1, wherein the one or more electromagnetic coils are arranged in an approximately curved fashion along a sputtering path at each end of the magnetic assembly.

3. The sputtering apparatus of claim 1, wherein the first and third magnetic orientations are parallel.

4. The sputtering apparatus of claim 1, wherein the second and third magnetic orientations are parallel.

5. The sputtering apparatus of claim 1, wherein the first set of magnets comprises a plurality of magnets.

6. The sputtering apparatus of claim 1, wherein the second set of magnets comprises a plurality of magnets.

7. The sputtering apparatus of claim 1, further comprising one or more magnetic field-shaping pole pieces disposed on top of the one or more pole pieces.

8. The sputtering apparatus of claim 1, wherein one or more of the first and second sets of magnets comprise permanent magnets.

9. The sputtering apparatus of claim 1, wherein the second set of magnets circumscribes at least a portion of the first magnet.

10. The sputtering apparatus of claim 1, wherein the first set of magnets has a length that is larger than a width of the first set of magnets.

11. The sputtering apparatus of claim 1, wherein the second set of magnets has a length that is larger than a width of the second set of magnets.

12. The sputtering apparatus of claim 1, wherein the magnetic assembly comprises 5 or more electromagnetic coils at each end of the magnetic assembly.

13. The sputtering apparatus of claim 1, wherein the first and second sets of magnets are oriented along a longitudinal axis of the elongated magnetic assembly.

14. The sputtering apparatus of claim 1, wherein the one or more electromagnetic coils are substantially disposed at end portions of the magnetic assembly.

15. A cylindrical rotatable magnetron sputtering apparatus, comprising:
    an elongated magnetic assembly having one or more electromagnetic coils between a first set of magnets and a second set of magnets, the one or more electromagnetic coils configured to provide a switchable magnetic field having a magnetic orientation that is parallel to the magnetic orientation of one of the first and second sets of magnets and opposite the magnetic orientation of the other of the first and second sets of magnets, wherein the one or more electromagnetic coils are disposed at end portions of the elongated magnetic assembly;
    one or more insulated wires in electric contact with the one or more electromagnetic coils, the one or more insulated wires configured to provide electric current to the one or more electromagnetic coils; and
    a backing tube for housing the magnetic assembly, the backing tube configured to hold a target material,
    wherein the backing tube is configured to rotate while the magnetic assembly remains stationary.

16. The cylindrical rotatable magnetron sputtering apparatus of claim 15, wherein the one or more electromagnetic coils are substantially disposed at end portions of the magnetic assembly.

17. The cylindrical rotatable magnetron sputtering apparatus of claim 15, wherein the first and second sets of magnets are oriented along a longitudinal axis of the elongated magnetic assembly.

18. A cylindrical rotatable magnetron sputtering device, comprising:
- an elongated magnetic assembly having a first set of electromagnetic coils and a second set of electromagnetic coils, each of the first and second sets of electromagnetic coils disposed between a first set of magnets and a second set of magnets, each of the first and second sets of electromagnetic coils configured to provide a switchable magnetic field having a magnetic orientation that is parallel to the magnetic orientation of one of the first and second sets of magnets and opposite the magnetic orientation of the other of the first and second sets of magnets, wherein the first set of electromagnetic coils are disposed at an end portion of the elongated magnetic assembly and the second set of electromagnetic coils are disposed at an opposing end portion of the elongated magnetic assembly;
- one or more insulated wires in electric contact with the first and second sets of electromagnetic coils, the one or more insulated wires configured to provide electric current to each of the first and second sets of electromagnetic coils; and
- a backing tube for housing the magnetic assembly, the backing tube configured to hold a target material.

19. The cylindrical rotatable magnetron sputtering device of claim 18, wherein the backing tube is configured to rotate while the magnetic assembly remains stationary.

20. The cylindrical rotatable magnetron sputtering device of claim 18, further comprising a plurality of insulated wires, wherein a first subset of the plurality of insulated wires is in electric contact with the first set of electromagnetic coils, and wherein a second subset of the plurality of insulated wires is in electric contact with the second set of electromagnetic coils.

21. The cylindrical rotatable magnetron sputtering device of claim 20, wherein each of the first subset and the second subset of the plurality of insulated wires is in electric contact with a separate power supply.

22. The cylindrical rotatable magnetron sputtering device of claim 18, wherein the one or more insulated wires include a pair of wires separately connected in parallel to the first and second sets of electromagnetic coils.

23. The cylindrical rotatable magnetron sputtering device of claim 18, wherein the one or more insulated wires include pairs of wires, each of the pairs of wires being connected to one of the first set and second set of electromagnetic coils.

24. The cylindrical rotatable magnetron sputtering device of claim 23, wherein each of the pairs of wires is in electric contact with a separate power supply.

25. The cylindrical rotatable magnetron sputtering device of claim 18, wherein each of the first and second sets of electromagnetic coils are substantially disposed at end portions of the magnetic assembly.

26. The cylindrical rotatable magnetron sputtering device of claim 18, wherein the first and second sets of magnets are oriented along a longitudinal axis of the elongated magnetic assembly.

* * * * *